United States Patent
Ukraintsev et al.

(10) Patent No.: US 9,891,280 B2
(45) Date of Patent: Feb. 13, 2018

(54) PROBE-BASED DATA COLLECTION SYSTEM WITH ADAPTIVE MODE OF PROBING CONTROLLED BY LOCAL SAMPLE PROPERTIES

(71) Applicant: FEI EFA, Inc., Fremont, CA (US)

(72) Inventors: Vladimir A. Ukraintsev, Allen, TX (US); Richard Stallcup, Frisco, TX (US); Sergiy Pryadkin, McKinney, TX (US); Mike Berkmyre, Princeton, TX (US); John Sanders, Dallas, TX (US)

(73) Assignee: FEI EFA, Inc., Fremont, CA (US)

( * ) Notice: Subject to any disclaimer, the term of this patent is extended or adjusted under 35 U.S.C. 154(b) by 0 days.

(21) Appl. No.: 15/368,516

(22) Filed: Dec. 2, 2016

(65) Prior Publication Data

US 2017/0082685 A1 Mar. 23, 2017

Related U.S. Application Data

(62) Division of application No. 14/314,013, filed on Jun. 24, 2014, now abandoned.

(Continued)

(51) Int. Cl.
*G01R 31/317* (2006.01)
*G01Q 60/18* (2010.01)
(Continued)

(52) U.S. Cl.
CPC ..... *G01R 31/31728* (2013.01); *G01Q 10/065* (2013.01); *G01Q 30/04* (2013.01);
(Continued)

(58) Field of Classification Search
CPC ...... G01Q 10/065; G01Q 30/04; G01Q 60/10; G01Q 60/18; G01R 31/311; G01R 31/31728
See application file for complete search history.

(56) References Cited

U.S. PATENT DOCUMENTS 3,258,326 A 6/1966 Rabussier
3,752,008 A 8/1973 Danek
(Continued)

FOREIGN PATENT DOCUMENTS

DE 102014118657 A1 6/2015
DE 112014002974 T5 6/2016
(Continued)

OTHER PUBLICATIONS

Invitation to Pay Additional Fees in International Application No. PCT/US2014/043975, dated Mar. 6, 2015.
(Continued)

*Primary Examiner* — Wyatt Stoffa
(74) *Attorney, Agent, or Firm* — Klarquist Sparkman, LLP

(57) ABSTRACT

A method for testing an integrated circuit (IC) using a nanoprobe, by using a scanning electron microscope (SEM) to register the nanoprobe to an identified feature on the IC; navigating the nanoprobe to a region of interest; scanning the nanoprobe over the surface of the IC while reading data from the nanoprobe; when the data from the nanoprobe indicates that the nanoprobe traverse a feature of interest, decelerating the scanning speed of the nanoprobe and performing testing of the IC. The scanning can be done at a prescribed nanoprobe tip force, and during the step of decelerating the scanning speed, the method further includes increasing the nanoprobe tip force.

13 Claims, 1 Drawing Sheet

Related U.S. Application Data

(60) Provisional application No. 61/838,744, filed on Jun. 24, 2013.

(51) Int. Cl.

| G01R 31/311 | (2006.01) |
|---|---|
| G01Q 10/06 | (2010.01) |
| G01Q 30/04 | (2010.01) |
| G01Q 60/10 | (2010.01) |
| G01Q 60/30 | (2010.01) |
| G01Q 60/46 | (2010.01) |

(52) U.S. Cl.
CPC ............. *G01Q 60/10* (2013.01); *G01Q 60/18* (2013.01); *G01R 31/311* (2013.01); *G01Q 60/30* (2013.01); *G01Q 60/46* (2013.01)

(56) References Cited

U.S. PATENT DOCUMENTS

| 4,101,072 A | 7/1978 | Weaver et al. |
|---|---|---|
| 4,142,793 A | 3/1979 | Schilling |
| 4,736,401 A | 4/1988 | Donges et al. |
| 4,798,989 A | 1/1989 | Miyazaki et al. |
| 4,874,945 A | 10/1989 | Dhi |
| 4,902,892 A | 2/1990 | Okayama et al. |
| 5,081,353 A | 1/1992 | Yamada et al. |
| 5,229,606 A | 7/1993 | Elings et al. |
| 5,239,313 A | 8/1993 | Marko et al. |
| 5,253,085 A | 10/1993 | Maruo et al. |
| 5,256,876 A | 10/1993 | Hazaki et al. |
| 5,267,471 A | 12/1993 | Abraham et al. |
| 5,312,510 A | 5/1994 | Poultney |
| 5,373,372 A | 12/1994 | Loewen |
| 5,455,420 A | 10/1995 | Ho et al. |
| 5,479,024 A * | 12/1995 | Hillner ............. B82Y 20/00 250/458.1 |
| 5,510,615 A | 4/1996 | Ho et al. |
| 5,710,052 A | 1/1998 | Alvis et al. |
| 5,713,667 A | 2/1998 | Alvis et al. |
| 5,763,879 A | 6/1998 | Zimmer et al. |
| 5,866,806 A | 2/1999 | Samsavar et al. |
| 5,899,703 A | 5/1999 | Kalter et al. |
| 5,905,577 A | 5/1999 | Wilsher et al. |
| 5,907,096 A | 5/1999 | Chen |
| 6,075,234 A * | 6/2000 | Patterson ............. G01R 31/311 250/207 |
| 6,287,880 B1 | 9/2001 | Erickson et al. |
| RE37,404 E | 10/2001 | Harp et al. |
| 6,399,400 B1 | 6/2002 | Osann, Jr. et al. |
| 6,520,005 B2 | 2/2003 | McWaid et al. |
| 6,643,012 B2 * | 11/2003 | Shen ............. B82Y 20/00 356/301 |
| 6,880,389 B2 | 4/2005 | Hare et al. |
| 6,891,170 B1 | 5/2005 | Yu et al. |
| 6,951,130 B2 | 10/2005 | Hare et al. |
| 6,953,927 B2 * | 10/2005 | Quake ............. G01Q 30/04 250/234 |
| 6,955,078 B2 | 10/2005 | Mancevski et al. |
| 6,967,335 B1 | 11/2005 | Dyer et al. |
| 7,057,409 B2 * | 6/2006 | Wills ............. G01R 31/31728 324/750.3 |
| 7,178,387 B1 | 2/2007 | Kley |
| 7,196,454 B2 | 3/2007 | Baur et al. |
| 7,220,973 B2 | 5/2007 | Yu et al. |
| 7,227,140 B2 | 6/2007 | Skidmore et al. |
| 7,285,778 B2 | 10/2007 | Baur et al. |
| 7,319,336 B2 | 1/2008 | Baur et al. |
| 7,446,550 B2 * | 11/2008 | McDowell ......... G01R 31/311 324/750.3 |
| 7,493,794 B2 | 2/2009 | Mancevski et al. |
| 7,513,142 B2 | 4/2009 | Rice et al. |
| 7,562,564 B2 | 7/2009 | Baba et al. |
| 7,675,300 B2 | 3/2010 | Baur et al. |
| 7,716,970 B2 | 5/2010 | Watanabe et al. |
| 8,484,755 B2 | 7/2013 | Leach et al. |
| 8,536,526 B2 | 9/2013 | Bell et al. |
| 9,057,740 B1 | 6/2015 | Ukraintsev et al. |
| 2002/0178800 A1 | 12/2002 | Hasegawa et al. |
| 2004/0133300 A1 | 7/2004 | Tsuboi et al. |
| 2004/0207424 A1 | 10/2004 | Hollman |
| 2005/0184028 A1 | 8/2005 | Baur et al. |
| 2005/0193576 A1 | 9/2005 | Hollman et al. |
| 2006/0261827 A1 | 11/2006 | Cooper et al. |
| 2006/0284083 A1 | 12/2006 | Kurenuma et al. |
| 2007/0179731 A1 | 8/2007 | Suri et al. |
| 2007/0187623 A1 | 8/2007 | Skidmore et al. |
| 2008/0065341 A1 | 3/2008 | Ishikawa et al. |
| 2008/0078506 A1 | 4/2008 | Verbeck et al. |
| 2008/0078745 A1 | 4/2008 | Cordell et al. |
| 2008/0150559 A1 | 6/2008 | Nayak et al. |
| 2008/0180118 A1 | 7/2008 | Itou et al. |
| 2010/0205697 A1 | 8/2010 | Iyoki et al. |
| 2011/0035848 A1 | 2/2011 | Perkins et al. |
| 2011/0221461 A1 | 9/2011 | Kanev et al. |
| 2012/0090056 A1 | 4/2012 | Hirooka et al. |
| 2015/0377921 A1 | 12/2015 | Ukraintsev et al. |
| 2015/0377958 A1 | 12/2015 | Ukraintsev et al. |

FOREIGN PATENT DOCUMENTS

| JP | 2003-156326 | 5/2003 |
|---|---|---|
| JP | 2005-233700 | 9/2005 |
| JP | 2008-089542 | 4/2008 |
| JP | 2015-129749 A | 7/2015 |
| JP | 2016530499 A | 9/2016 |
| TW | 200831853 A | 8/2008 |
| TW | 201102658 A1 | 1/2011 |
| TW | 201113528 A | 4/2011 |
| TW | 201532102 A | 8/2015 |
| TW | 201600861 A | 1/2016 |
| TW | 201611074 A | 3/2016 |
| WO | WO 2014/210083 | 12/2014 |
| WO | WO 2015/200719 A1 | 12/2015 |
| WO | WO 2015/200724 A1 | 12/2015 |

OTHER PUBLICATIONS

Kane, T., Microelectron. Div., IBM Syst. Technol. Group, Hopewell Junction, NY, USA, "In Fab 300 mm Wafer Level Atomic Force Probe Characterization," Proc. Of the International Symposium for Testing and Failure Analysis, pp. 71-76 (Nov. 2012).

Kane, T., Microelectron. Div., IBM Syst. Technol. Group, Hopewell Junction, NY, USA "300mm wafer Atomic force probe characterization methodology," International Symposium on the Components, Circuits, Devices & Systems I, Physical and Failure Analysis of Integrated Circuits, 2010 17th IEEE, Jul. 5-9, 2010, Singapore, IEEE, pp. 1-3.

Kuhn, K. et al., Intel's 45nm CMOS Technology: "Managing Process Variation in Intel's 45nm CMOS Technology," Intel Technology Journal, vol. 12, Issue 2, Jun. 17, 2008, pp. 92-110.

Ukraintsev, V. et al., "Distributed force probe bending model of critical dimension atomic force microscopy bias," J. Micro/Nanolith. MEMS MOEMS, vol. 12, Issue 2, Apr.-Jun. 2013, pp. 23009-1 through 23009-15.

Vickers, J.S., Rubix, "A Hybrid Between Ruby, LVi, & LVx the performance of Ruby with the simplicity of LVx," DCG Systems, Inc., Technology Summit 2013, 18 pages.

International Search Report in International Patent Application No. PCT/US2014/043975, dated May 19, 2015.

Kleindiek Nanotechnik, ProbeWorkstation found online at http://www.nanotechnik.com/probeworkstation.html, website accessed Jun. 22, 2015, 3 pages.

Merlin Series: From Imaging to Your Complete Lab: Analytical Power for the Sub-Nanometer World, Interactive PDF, Release 1.0, ZEISS White Paper, downloaded from http://www.zeiss.com/microscopy/en_us/products/scanning-electron-microscopes/merlin-materials.html#downloads, on Jun. 22, 2015, 20 pages.

(56) References Cited

OTHER PUBLICATIONS

Nanonics Imaging Ltd., 3TB4000 Combined AFM FIB and AFM SEM found online at http://www.nanonics.co.il/ products/nsom-spm-systems/combined-afm-fib-and-afm-sem.html?gclid=CJq59Lmrr4CFWVp7AodeiMAYw, website accessed Jun. 22, 2015, 3 pages.

Park XE-3DM, Automated Industrial AFM for High-Resolution 3D Metrology Overview, found online at http://www.parkafm.condindex.php/products/industrial-afm/park-xe-3dm/overview, website accessed Jun. 22, 2015, 3 pages.

Zeiss: Merlin Analytical Power for the sub-nanometer world: Introduction, found online at http://www.zeiss.com/ microscopy/en us/products/scanning-electron-microscopes/merlin-materials.html#introduction, website accessed Jun. 22, 2015, 2 pages.

Zeiss: Merlin Analytical Power for the sub-nanometer world: Downloads, found online at http://www.zeiss.com/ microscopy/en_us/products/scanning-electron-microscopes/merlin-materials.html#downloads, website accessed Jun. 22, 2015, 2 pages.

Advic, A. et al., "Fabrication of cone-shaped boron doped diamond and gold nanoelectrodes for AFM-SECM," Nanotechnology, Mar. 3, 2011, vol. 22, 145306, pp. 1-6.

Altmann, F. et al., "Evaluation of combined EBIC/FIB methods for solar cell activation," Fraunhofer Institute for Mechanics of Materials Halle, Drei-Lander FIB Workshop, Jun. 28-29, 2010, Vienna, 23 pages.

Dickson, K. et al., "Electron Beam Absorbed Current as a Means of Locating Metal Defectivity on 45nm SOI Technology," ISTFA 2010, Proceedings from the 36th International Symposium for Testing and Failure Analysis, Nov. 14-18, 2010, Addison, TX, pp. 413-422.

Eifert, A. et al., "Atomic force microscopy probes with integrated boron doped diamond electrodes: Fabrication and application," Electrochemistry Communications, vol. 25, 2012, pp. 30-34.

Erington, K. et al., "Advanced Backside Defect Isloation Techniques Using Electron Beam Absombed Current to Locate Metal Defectivity on Bulk and SOI Technology," ISTFA 2011, Proceedings from the 37th International Symposium for Testing and Failure Analysis, Nov. 13-17, 2011, San Jose, CA, pp. 275-286.

Gatan: An Introduction to EBIC: Whitepaper, Available online at http://info.gatan.com/acton/attachment/11413/ f-02a3/1/-/-/-/-/App%20Note%20Intro%20to%20EBIC%20FL2.pdf, accessed on Jun. 29, 2015, 6 pages.

Gatan: Smart EBIC: Product Datasheet, Available online at http://www.gatan.com/products/sem-imaging—ispectroscopy/smartebic-system, accessed on Jun. 29, 2015, 4 pages.

Ippolito, S. et al., "Active Electrostatic Force Microscopy," Physical and Failure Analysis of Integrated Circuits (IPFA), 2015 22nd IEEE International Symposium, Taiwan, Jun. 29, 2015, Session 17-1, 3 pages.

Ippolito, S. et al., "Emerging Techniques in Atomic Force Microscopy: Diamond Milling and Electrostatic Force Microscopy," EDFAAO, Electronic Device Failure Analysis, vol. 17, Issue 3, 2015, pp. 4-10.

Kane, T. et al., "Wafer Level Atomic Force Probing," Proceedings from the 36th International Symposium for Testing and Failure Analysis, Nov. 14-18, 2010, Addison, Texas, ISTFA 2010, pp. 317-319.

Larre, P. et al., "Precise Localization of 28nm via chain resistive defect using EBAC and nanoprobing," ISTFA 2012, Proceedings from the 38th International Symposium for Testing and Failure Analysis, Nov. 11-15, 2012, Phoenix, AZ, pp. 67-70.

Lin, W.P. et al., "Physical Failure Analysis Cases by Electron Beam Absorbed Current & Electron Beam Induced Current Detection on Nano-Probing SEM System," Physical and Failure Analysis of Integrated Circuits (IPFA), 2010 17th IEEE International Symposium, Jul. 5-9, 2010, 4 pages.

Nagatani, G. et al., "Fault Isolation of Sub-surface Leakage Defects Using Electron Beam Induced Current Characterization in Next-Generation Flash Memory Technology Development," ISTFA 2010, Proceedings from the 36th International Symposium for Testing and Failure Analysis, Nov. 14-18, 2010, Addison, TX, pp. 62-65.

Quah, Act. et al., "Failure Analysis Methodology on Resistive Open Defects," ISTFA 2014, Proceedings from the 40th International Symposium for Testing and Failure Analysis, Nov. 9-13, 2014, Houston, TX, ASM International, pp. 354-358.

Smirnov, W. et al., "Diamond-Modified AFM Probes: From Diamond Nanowires to Atomic Force Microscopy-Integrated Boron-Doped Diamond Electrodes," Anal. Chem., vol. 83, pp. 4936-4941 (2011).

Strizich, M., "Electron Beam Induced Current Isolation Techniques," Available online at http://www.analyticalsol.com/ files/TechnicalArticles/EBIC_article.pdf, accessed Jun. 29, 2015, 3 pages.

Strizich, M., "Voltage Contrast and EBIC Failure Isolation Techniques," EDFAAO, Electronic Device Failure Analysis, vol. 9, Issue 1, 2007, pp. 20-23.

Yaliang, C. et al., "Absorbed-Specimen Current Imaging Implementation and Characterization in Nano-Prober for Resistive Interconnects Isolation in 45-nm Silicon-on-Insulator Microprocessors," Physical and Failure Analysis of Integrated Circuits, 2010 17th IEEE International Symposium on Jul. 5-9, 2010, 5 pages.

Ippoloto, S., et al., "Diamond Milling with an Atomic Force Microscope," Physical and Failure Analysis of Integrated Circuits, 2015 IEEE 22nd International Symposium, on Jun. 29, 2015-Jul. 2, 2015, 5 pages.

Notice of Allowance for U.S. Appl. No. 14/108,286 dated Feb. 11, 2015.

Invitation to Pay Additional Fees for PCT/U52015/037824 dated Sep. 8, 2015.

International Search Report and Written Opinion for International Patent Application No. PCT/U52015/037824 dated Dec. 4, 2015.

Invitation to Pay Additional Fees for PCT/U52015/037829 dated Sep. 8, 2015.

International Search Report and Written Opinion for International Patent Application No. PCT/US2015/037829 dated Dec. 7, 2015.

Examination Report for Taiwanese Patent Application No. 103143626 dated Mar. 22, 2016.

Examination Report for Taiwanese Patent Application No. 104120476 dated Aug. 15, 2016.

Notice of Reasons of Refusal from Japanese Application No. 2016-523868, dated Oct. 17, 2017, 7 pages (with English translation).

\* cited by examiner

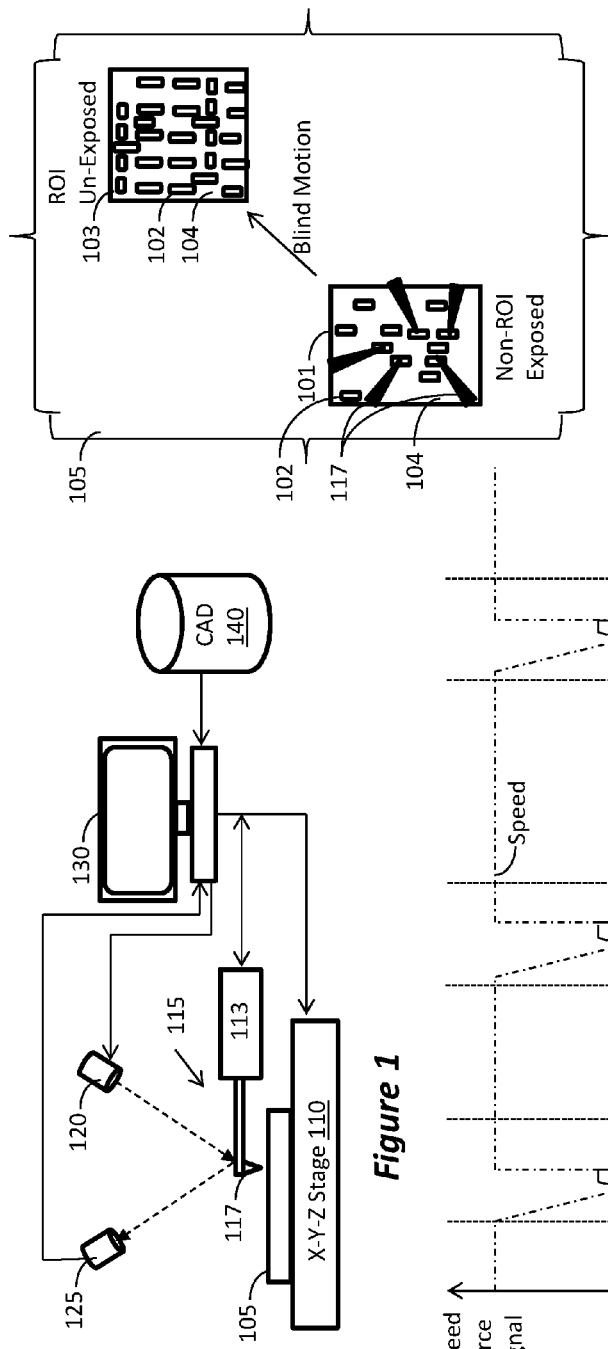
*Figure 1*
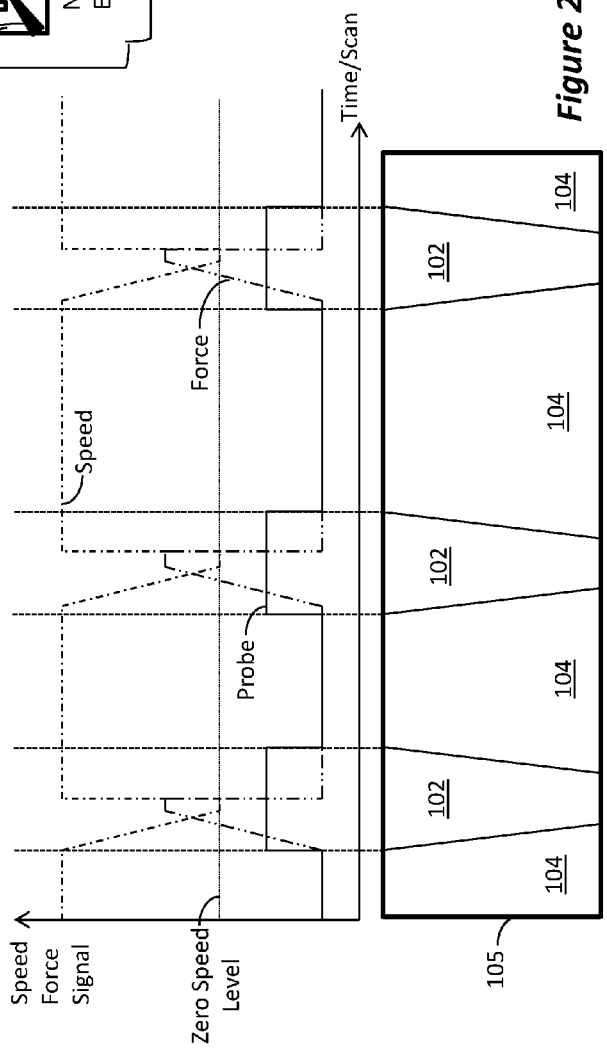
*Figure 2*
*Figure 3*

PROBE-BASED DATA COLLECTION SYSTEM WITH ADAPTIVE MODE OF PROBING CONTROLLED BY LOCAL SAMPLE PROPERTIES

CROSS-REFERENCE TO RELATED APPLICATIONS

This is a divisional application of U.S. patent application Ser. No. 14/314,013, filed on Jun. 24, 2014, which claims the benefit of priority from U.S. Provisional Patent Application No. 61/838,744 filed on Jun. 24, 2013, and the disclosures of which are hereby incorporated herein by reference in their entireties.

BACKGROUND

1. Field of Invention

This invention is in the field of sample probing (including electrical) using scanning probe and nanoprobing systems.

2. Related Art

Nanoprobing (using scanning or point probing) is a very broad field of analytical science covering various types of electrical, mechanical, compositional and chemical physical characterization of nano-size objects. Nanoelectronic devices and their components are examples of such objects. Electrical probing of single transistors, memory bitcell and critical parts of integrated circuits (IC) is used widely to test performance of newly designed IC and to correct potential problems of the specific IC design or/and overall technology.

To test the elements of an IC, the nanoprobes are made to physically contact the surface of the IC and to scan the surface of the IC. The scanning can be used to generate topography image, capacitance image (dC/dV), etc. To generate those images, every pixel of the image is generated as the probe scan the surface at the same speed and with the same force applied to the probe. However, there are circumstances wherein certain areas of the scanning are not of interest for the particular test, in which case there's no need for slow, high-resolution scanning. In other cases, certain areas of the region of interest (ROI) may constitute a softer or more sensitive layer, such that less force should be applied. In yet other cases the probes should simply contact certain elements without the need for scanning, e.g., to read electrical signals in a point probing mode. Thus, there's a need for improved nanoprobing device and method for operating the nanoprobes, such that the above cases are taken into consideration.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various disclosed embodiments utilize systems and methods wherein the probe scanning speed and force are variable during the scanning of the sample. When the probes are scanning areas that are of no interest, the speed can be increased until a new area of interest is reached, wherein the speed is decreased. Similarly, when the probe is scanning a sensitive area, or area of no interest, the force can be reduced, to prevent damage to the sensitive area and to reduce wear of the probes. For example, when the probes are scanning over an interlayer dielectric, the force should be reduced (to cause less sample damage and less probe-tip wear) and the speed should be increased (to provide higher throughput, even at reduced resolution), since the dielectric area is of no interest for the electrical testing).

In other embodiments, the probes are used to collect electrical data and, therefore, need not scan the sample, but rather contact specific points on the device. In such cases, the probes' positions are registered to the sample outside of the area of interest. Then, the probes are moved blindly above the sample, i.e., without physical contact with the sample, to the ROI using a priori knowledge of the circuit layout (e.g., from CAD file). When the probes are in the proper position above the specific points, the probes are moved down so as to "land" on the appropriate points.

According to disclosed embodiments, an adaptive (i.e., variable) mode of probe motion is executed during sample probing. The adaptive mode operates the probes to test the sample using a combination of any of the following modes of motion: hopping, contact scanning, non-contact scanning, taping, scanning with variable feedback type, scanning at different speeds, scanning at different force, scanning at different amplitude of oscillation, etc. The specific mode of motion is selected according to the local properties of the sample, which may be known a priory (for example from CAD information) or/and assessed in real time (for example from robust high signal-to-noise ratio electrical or mechanical probe signal).

The embodiments are beneficial as data quality improvement achieved using an optimized probe-sample interaction adjusted for and dependent on (1) local properties of the sample and also (2) type of measurement to be done at the particular location. The embodiments are also beneficial for preserving of the sample and probe(s) for repeatable and precise measurements on the stable sample-probe system, by avoiding unnecessary wear of the probe tips.

DRAWINGS

Other aspects and features of the invention would be apparent from the detailed description, which is made with reference to the following drawings. It should be mentioned that the detailed description and the drawings provide various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates a probing system according to one embodiment;

FIG. 2 illustrates various probing modes according to an embodiment;

FIG. 3 illustrates registration and blind move according to one embodiment.

DETAILED DESCRIPTION

Various embodiments will be described below to achieve the benefits of the invention. Some of the benefits include the following.

(1) Scanning a sample with physical contact of the probe tip can damage the sample. For certain locations or parts of the sample, physical contact with prescribed force or pressure is required in order to obtain the needed data. However, there are cases where some parts of the sample are not that critical for the tests. In such cases, disclosed embodiments avoid damage caused by contact mode of scanning.

(2) The prober throughput and data quality can be optimized using high-speed low-pressure or non-contact motion over areas of no-interest, and slow increased-pressure contact motion (optimized) or even a full stop at sites of interest (for the period of time needed to achieve desired quality of data).

(3) The probe tip lifetime can be improved by avoiding high pressure and/or contact with the sample when not needed. The probe tip can be made to "fly" over areas of no-interest at safe height above the sample's surface.

(4) When high-integrity electrical data needs to be collected from the sample, the data quality can be improved by placing the probe in complete stop and full contact during data acquisition.

The above benefits are achieved by the following embodiments.

FIG. 1 illustrates a nanoprober system according to one embodiments of the invention. A sample 105, such as a microchip, is placed on an x-y-z stage 110. The stage 110 may be controlled by controller 130, or by a separate stage controller. A nanoprober 115 includes an actuator 113, for example, a piezoelectric actuator, and a probe tip 117. The probe tip 117 can be placed and/or moved across the surface of sample 105, by the motion of the actuator 113. The actuator 113 is controlled by controller 130. Also, if data is collected from the probe tip 117, the data is sent to the controller 130. Additionally, the motion of the tip 117 can be sensed by illuminating the tip using laser 120 and sensing the reflection using optical sensor 125. The illumination and optical sensing can be controlled using the same controller 130. The optical sensing is especially beneficial for sensing z-motion, i.e., changes of elevation, amplitude and frequency of oscillation of the probe tip 117, so as to create topography map, surface potential map, capacitance map, etc. More information about this technique can be found in U.S. Pat. No. 5,267,471, the disclosure of which is incorporated herein by reference in its entirety. While in FIG. 1 only one nanoprober 115 is illustrated, in the various embodiments described, a plurality of nanoprobers is used to simultaneously test the sample. In one example, eight nanoprober tips are controlled simultaneously by the controller 130.

FIG. 2 illustrates an embodiment of a method for adoptive scanning the probe tips 117, such as illustrated in FIG. 1. A cross-section of part of sample 105 is illustrated at the bottom of FIG. 2. In this example, the sample 105 has metal areas 102 and areas of interlayer dielectric 104. Scanning and time progresses from left to right and is shown on the x-axis of the plot in the upper part of FIG. 2. The speed (shown as dotted line) and the force of scanning (shown by double-dotted line) are controlled by the controller according to the probing signal (shown in solid line), read from the prober. Speed, force and probe signals are plotted over the Y-axis. For example, if checking the probe signal for conductivity or capacitive signal (dC/dV), when the probe tip is over the dielectric region 104, i.e., on the left side of the sample 105, no or low-level signal is read from the prober. During this time, the prober is operated at high speed and low pressure mode. Once the high-level signal is detected (solid-line plot), it indicates that the probe tip is traversing over a conductive region 102. The speed is then slowed down until it the prober reaches full stop. Meanwhile, the force is increased and data acquisition starts. The force can be measured by, e.g., stress or strain sensors measuring the bending of the probe tip and feeding the signal to the controller 130. Once proper probing signal-to-noise level is achieved, data acquisition stops and scanning is continued at the high speed and with low (or zero) force of contact. The scanning proceeds in this mode until the next indication of metal or high signal region is reached, wherein the process repeats.

According to another example, the changes of scanning speed and force of probe-sample interaction is triggered by CAD information from a CAD file 140 (FIG. 1). Moreover, the CAD data file can be used together with the capacitance (dC/dV) or any other signal. For example, when the CAD data indicates that the probe tip is over regions representing interlayer dielectric, these regions could be skipped all together (hopped over) or scanned with the fastest speed and the lowest contact force. Then, prior to reaching an area indicated by the CAD data to correspond to a conductive (or other feature of interest), the speed is slowed and the force may or may not be increased, and the scan is continued while reading the capacitance or other data from the prober. Once a pre-set threshold of capacitance dC/dV signal is detected, the probe scanning is controlled according to the speed/force signals shown in FIG. 2. The data acquisition continues until proper signal-to-noise ratio is achieved, and then scanning at the high speed and low (possibly zero for hopping) force is continued towards the next feature, as indicated by the CAD data. Thus, according to this embodiment, three modes can be used: hopping (no contact, zero force, and highest speed), high speed/low force, and deceleration to a stop while increasing force to a maximum set point.

According to one embodiment, the probe to sample registration is conducted outside of the area of interest. The probe can be registered to the sample using imaging, e.g., scanning electron microscope (SEM) imaging. The sample may also be registered to a CAD pattern, if it is to be used for hopping/scanning modes. Once the probes are registered to SEM image and CAD pattern, "blind moves" to the points of interest followed by data acquisition could be made. The blind moves can be assisted using the CAD data for navigation, similar to a GPS (global position system). Depending on the amount of probe vs. stage drift, periodic probe to sample re-registration and correction may be needed.

FIG. 3 illustrates the use of SEM for registration, and then performing blind motion to the ROI using, e.g., CAD data. In FIG. 3, a section of sample 105 is illustrated, wherein two particular sections are delineated, an ROI (which may be sensitive device) and a non-ROI (which may be an alignment target or a feature of no interest). Within the delineated areas part of the surface is dielectric 104, and parts are features of interest 102, e.g., metal contacts, metal lines, etc. The non-ROI section is first imaged using SEM, and the probe tips 117 are landed on the sample. Tip position for each probe is registered to the sample SEM image and the corresponding CAD pattern. Since this delineated area is not of interest, it can be exposed to e-beam of the SEM. However, in order not to disturb or damage the ROI, no e-beam is scanned over the ROI, such that no SEM image of the ROI is produced. Instead, the system uses information from CAD design or other navigation aid, to blindly move each tip to a selected feature of interest in the ROI and land the tips on the selected features of interest in the ROI. According to one example, the move is followed by data acquisition with zero probe speed and optimal force of contact, followed by blind move to the next area of interest or back to the registration no-interest area. Moves are done using CAD or/and other navigation data. During every return to the registration point, probe to sample position is re-adjusted. The later will reduce probe to sample registration inaccuracy caused by slow relative drift of the two (for example by thermal drift).

Although electrical nanoprobing was provided as an example of adaptive probing, the same approach can be used for other types of probing. According to one example, tip-enhanced optical circuit analysis (TE OCA) can be done using so-called backside approach. With this approach Si wafer is thinned to about 100 nm thickness. IC tester is connected to the IC from the front side in a normal manner. Standard IC tests are conducted on the thinned chip. Electro-optical emission from operating FET p/n junctions is usually detected using high-resolution high numerical aperture optics (www.dcg.systems.com). In this example nanoprober tip is brought to the ROI from the back side of the wafer.

The metal probe is acting as an antenna which amplifies electro-magnetic (EM) field in the probe apex proximity (the effect is similar to the tip-enhanced Raman spectroscopy or TERS). As a result, at any moment of time low-resolution optics (placed at the back side of the wafer) collects photons mostly from the probe apex proximity (where EM field is amplified). Once collected signal is synchronized with the probe position, the high-resolution map of electro-optical emission is constructed.

According to another embodiment of this example nanoprober tip is moving parallel to the backside of the wafer with variable speed and at variable distance between the sample surface and the probe. Such adoptive (speed and distance) probe motion will improve throughput, signal-to-noise and lateral resolution of the TE OCA method.

In another example the front side TE optical spectroscopy (Raman or fluorescence) can be used for high resolution and throughput defect analysis. A large laser spot is used to irradiate sample. The probe is scanned over ROI with low (nanometer) scale topography. Low resolution optics is used for collection of scattered (Raman or/and fluorescence) photon. The method spatial resolution is defined by the size of the probe apex and not by the resolution of photon collection optics. Throughput of the method is usually very low since long per pixel time is used to collect sufficient number of scattered photons. If one tries to collect spectral map of the scattered photons the data collection time becomes almost impractical. Adoptive scanning helps to reduce the data acquisition time. Tip is scanned at high speed collecting monochrome signal with relatively poor signal-to-noise. Once suspicious (monochrome) signal is detected at certain locations the probe stops at the spot and tool collects high signal-to-noise spectral data.

The invention claimed is:

1. An apparatus for performing probing on an integrated circuits (IC), comprising:
   a stage configured for supporting the IC and configured to enable connecting an IC tester to front side of the IC to conduct tests on the sample;
   a prober having a probe tip;
   an actuator activating the prober to position the probe tip at a region of interest (ROI) at a back side of the sample, wherein the probe tip is acting as an antenna which amplifies electro-magnetic (EM) field, thereby amplifying electro-optical emission from operating devices within the sample;
   collection optics positioned at the backside of the sample and collect photons in proximity to the probe tip;
   a controller collecting data signals from the collection optics synchronized with the prober position, and generating map of electro-optical emission over the IC.

2. The apparatus of claim 1, wherein the controller is further preprogrammed to read a CAD design data corresponding to the sample, and to further control the actuating signals according to the CAD design data indicating dielectric regions and conductive regions.

3. The apparatus of claim 1, wherein the controller is further preprogrammed to register the prober to an image obtained by a scanning electron microscope outside of an area of interest.

4. The apparatus of claim 1, wherein the actuator is configured to move the probe tip parallel to the backside of the IC with variable speed and at variable distance between the IC backside and the probe tip.

5. A method of performing integrated circuits (IC) probing using a prober having a probe tip, comprising the steps of:
   applying test signals to the IC from a front surface of the IC to thereby cause electro-optical emission from operating p/n junctions within the IC;
   placing the probe tip over a back surface of the IC; and,
   placing collection optics to collect photons of the electro-optical emission from proximity of the probe tip.

6. The method of claim 5, further comprising thinning the IC to 100 nm prior to performing the probing.

7. The method of claim 5, further comprising scanning the probe tip over the back surface of the IC.

8. The method of claim 5, further comprising scanning the probe tip over the back surface of the IC at variable speed and at variable distance between back surface and the probe tip.

9. The method of claim 5, further comprising collecting data signals from the collection optics synchronized with position of the probe tip.

10. The method of claim 9, further comprising generating map of electro-optical emission over the IC.

11. The method of claim 5, further comprising the steps:
    registering the probe tip to the IC outside of an area of interest (ROI); and,
    blindly moving the probe tip to the area of interest.

12. The method of claim 11, wherein blindly moving is performed by moving the probe tip without contacting the sample.

13. The method of claim 12, further comprising assessing test data quality prior to accelerating the probe tip.

* * * * *